United States Patent
Lyalin (10) Patent No.: US 12,224,716 B2
(45) Date of Patent: Feb. 11, 2025

(54) POWER AMPLIFIER HAVING ANALOG PRE-DISTORTION BY ADAPTIVE DEGENERATIVE FEEDBACK

(71) Applicant: SKYWORKS SOLUTIONS, INC., Irvine, CA (US)

(72) Inventor: Aleksey A. Lyalin, Moorpark, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 516 days.

(21) Appl. No.: 17/562,249

(22) Filed: Dec. 27, 2021

(65) Prior Publication Data

US 2022/0231640 A1 Jul. 21, 2022

Related U.S. Application Data (60) Provisional application No. 63/132,419, filed on Dec. 30, 2020.

(51) Int. Cl.
  *H03F 1/32* (2006.01)
  *H03F 3/24* (2006.01)
  *H04B 1/04* (2006.01)
(52) U.S. Cl.
  CPC ........... *H03F 1/3241* (2013.01); *H03F 3/245* (2013.01); *H03F 2200/451* (2013.01); *H04B 2001/0425* (2013.01); *H04B 1/0475* (2013.01)
(58) Field of Classification Search
  CPC ..................................... H03F 1/32; H03F 1/30
  USPC ......................................... 330/149, 296, 285
  See application file for complete search history.

(56) References Cited

U.S. PATENT DOCUMENTS

| | | | |
|---|---|---|---|
| 6,967,531 B1* | 11/2005 | Seymour | H03F 3/189 330/148 |
| 8,213,142 B2* | 7/2012 | Worley | H01L 27/0255 361/118 |
| 8,669,812 B2* | 3/2014 | Actis | H03F 3/195 330/54 |
| 2003/0193370 A1 | 10/2003 | Leifso et al. | |
| 2014/0203872 A1 | 7/2014 | Sjoland | |
| 2019/0348955 A1 | 11/2019 | Day | |
| 2020/0259467 A1 | 8/2020 | Wallis | |
| 2020/0313638 A1 | 10/2020 | Hong et al. | |

OTHER PUBLICATIONS

International Search Report dated Apr. 21, 2022 for PCT/US2021/065199.
Written Opinion dated Apr. 21, 2022 for PCT/US2021/065199.

* cited by examiner

*Primary Examiner* — Henry Choe
(74) *Attorney, Agent, or Firm* — Chang & Hale LLP (57) ABSTRACT

Power amplifier having analog pre-distortion by adaptive degenerative feedback. In some embodiments, a pre-distortion circuit for an amplifier can include a transistor having an input node for receiving an input signal, an output node for providing an output signal having a gain relative to the input signal, and a common node for coupling to a ground. The pre-distortion circuit can further include a degeneration circuit implemented between the common node and the ground, with the degeneration circuit being configured to introduce a feedback response that reduces the gain when the input signal has a power level at or below a selected level. The degeneration circuit can be further configured to be disabled or provide a reduced feedback response when the input signal has a power level that exceeds the selected level.

15 Claims, 12 Drawing Sheets

POWER AMPLIFIER HAVING ANALOG PRE-DISTORTION BY ADAPTIVE DEGENERATIVE FEEDBACK

CROSS-REFERENCE TO RELATED APPLICATION(S)

This application claims priority to U.S. Provisional Application No. 63/132,419 filed Dec. 30, 2020, entitled ANALOG PRE-DISTORTION BY ADAPTIVE DEGENERATIVE FEEDBACK, the disclosure of which is hereby expressly incorporated by reference herein in its respective entirety.

BACKGROUND

Field

The present disclosure relates to power amplifiers such as radio-frequency power amplifiers.

Description of the Related Art

In radio-frequency applications, a signal to be transmitted is typically generated by a transceiver, and such a signal is amplified by a power amplifier. The amplified signal is then typically routed to an antenna through, for example, a transmit filter and a switching circuit, for transmission.

SUMMARY

In accordance with a number of implementations, the present disclosure relates to a pre-distortion circuit for an amplifier. The pre-distortion circuit includes a transistor having an input node for receiving an input signal, an output node for providing an output signal having a gain relative to the input signal, and a common node for coupling to a ground. The pre-distortion circuit further includes a degeneration circuit implemented between the common node and the ground. The degeneration circuit is configured to introduce a feedback response that reduces the gain when the input signal has a power level at or below a selected level, and to be disabled or provide a reduced feedback response when the input signal has a power level that exceeds the selected level.

In some embodiments, the transistor can be implemented as a bipolar-junction transistor having a base, an emitter, and a collector, such that the base provides the input node, the collector provides the output node, and the emitter provides the common node.

In some embodiments, the degeneration circuit can include a resistance implemented between the common node and the ground, and an antiparallel combination of first and second diodes implemented between the common node and the ground. The first and second diodes can be configured to turn on when the power level of the input signal exceeds the selected level. In some embodiments, the degeneration circuit can be further configured to provide a phase control functionality. The phase control functionality can include an AM-to-PM phase control functionality.

In some embodiments, the degeneration circuit can further include an inductance and a capacitance, each being implemented to be electrically parallel with the resistance, and between the common node and the ground. At least one of the inductance and the capacitance can be configured to provide the phase control functionality.

In some embodiments, the degeneration circuit can be further configured such that the selected level is compensated for a variation in temperature. The degeneration circuit can further include a voltage source configured to apply a bias to the first and second diodes. The voltage source can be implemented to be between each of the first and second diodes and the ground. The voltage source can be configured to provide a temperature-dependent voltage to each of the first and second diodes.

According to some teachings, the present disclosure relates to method for pre-distorting a signal for an amplifier. The method includes providing a transistor having an input node for receiving an input signal, an output node for providing an output signal having a gain relative to the input signal, and a common node for coupling to a ground. The method further includes introducing a feedback response, with a degeneration circuit implemented between the common node and the ground, such that the feedback response includes a reduction in the gain when the input signal has a power level at or below a selected level, and a disablement or a reduction of the feedback response when the input signal has a power level that exceeds the selected level.

In some implementations, the present disclosure relates to an amplifier that includes a pre-driver stage configured to receive an input signal and generate an output signal having a gain relative to the input signal. The amplifier further includes an amplification stage configured to receive an input signal representative of the output signal of the pre-driver stage and to generate an amplified signal. The amplifier further includes a pre-distortion circuit coupled to the pre-driver stage and configured to introduce a feedback response that reduces the gain when the input signal of the pre-driver stage has a power level at or below a selected level, and to disable or provide a reduced feedback response when the input signal of the pre-driver stage has a power level that exceeds the selected level.

In some embodiments, the pre-driver stage can include a transistor having an input node for receiving the input signal, an output node for providing the output signal, and a common node for coupling to a ground. The pre-distortion circuit can include a degeneration circuit implemented between the common node and the ground. The degeneration circuit can include a resistance implemented between the common node and the ground, and an antiparallel combination of first and second diodes implemented between the common node and the ground. The first and second diodes can be configured to turn on when the power level of the input signal exceeds the selected level.

In some embodiments, the degeneration circuit can be configured to provide a phase control functionality. In some embodiments, the degeneration circuit can be configured such that the selected level is compensated for a variation in temperature.

In some embodiments, the amplifier can be a power amplifier.

In some implementations, the present disclosure relates to a method for amplifying a signal. The method includes pre-driving an input signal to generate an output signal having a gain relative to the input signal. The method further includes amplifying the output signal of the pre-driving to generate an amplified signal. The method further includes performing a pre-distortion operation with respect to the pre-driving to introduce a feedback response that reduces the gain when the input signal has a power level at or below a selected level, and to disable or provide a reduced feedback response when the input signal has a power level that exceeds the selected level.

In some teachings, the present disclosure relates to a semiconductor die that includes a semiconductor substrate and a pre-distortion circuit implemented on the semiconductor substrate. The pre-distortion circuit includes a transistor having an input node for receiving an input signal, an output node for providing an output signal having a gain relative to the input signal, and a common node for coupling to a ground. The pre-distortion circuit further includes a degeneration circuit implemented between the common node and the ground. The degeneration circuit is configured to introduce a feedback response that reduces the gain when the input signal has a power level at or below a selected level, and to be disabled or provide a reduced feedback response when the input signal has a power level that exceeds the selected level.

In some embodiments, the semiconductor die can further include an amplifier stage configured to provide power amplification for the output signal generated by the transistor of the pre-distortion circuit.

In some implementations, the present disclosure relates to a radio-frequency module that includes a packaging substrate configured to receive a plurality of components, and a pre-distortion circuit implemented on the packaging substrate. The pre-distortion circuit includes a transistor having an input node for receiving an input signal, an output node for providing an output signal having a gain relative to the input signal, and a common node for coupling to a ground. The pre-distortion circuit further includes a degeneration circuit implemented between the common node and the ground. The degeneration circuit is configured to introduce a feedback response that reduces the gain when the input signal has a power level at or below a selected level, and to be disabled or provide a reduced feedback response when the input signal has a power level that exceeds the selected level.

In some implementations, the present disclosure relates to a semiconductor die that includes a semiconductor substrate and an amplifier circuit implemented on the semiconductor substrate. The amplifier circuit includes a pre-driver stage configured to receive an input signal and generate an output signal having a gain relative to the input signal, and an amplification stage configured to receive an input signal representative of the output signal of the pre-driver stage and to generate an amplified signal. The amplifier circuit further includes a pre-distortion circuit coupled to the pre-driver stage and configured to introduce a feedback response that reduces the gain when the input signal of the pre-driver stage has a power level at or below a selected level, and to disable or provide a reduced feedback response when the input signal of the pre-driver stage has a power level that exceeds the selected level.

According to some implementations, the present disclosure relates to a radio-frequency module that includes a packaging substrate configured to receive a plurality of components, and an amplifier circuit implemented on the packaging substrate. The amplifier circuit includes a pre-driver stage configured to receive an input signal and generate an output signal having a gain relative to the input signal, and an amplification stage configured to receive an input signal representative of the output signal of the pre-driver stage and to generate an amplified signal. The amplifier circuit further includes a pre-distortion circuit coupled to the pre-driver stage and configured to introduce a feedback response that reduces the gain when the input signal of the pre-driver stage has a power level at or below a selected level, and to disable or provide a reduced feedback response when the input signal of the pre-driver stage has a power level that exceeds the selected level.

In some implementations, the present disclosure relates to a wireless device that includes a transceiver, an antenna, and an amplifier circuit implemented to be electrically between the transceiver and the antenna. The amplifier circuit includes a pre-distortion circuit having a transistor with an input node for receiving an input signal, an output node for providing an output signal having a gain relative to the input signal, and a common node for coupling to a ground. The pre-distortion circuit further includes a degeneration circuit implemented between the common node and the ground. The degeneration circuit is configured to introduce a feedback response that reduces the gain when the input signal has a power level at or below a selected level, and to be disabled or provide a reduced feedback response when the input signal has a power level that exceeds the selected level.

In some implementations, the present disclosure relates to a wireless device that includes a transceiver, an antenna, and an amplifier circuit implemented to be electrically between the transceiver and the antenna. The amplifier circuit includes a pre-driver stage configured to receive an input signal and generate an output signal having a gain relative to the input signal, and an amplification stage configured to receive an input signal representative of the output signal of the pre-driver stage and to generate an amplified signal. The amplifier circuit further includes a pre-distortion circuit coupled to the pre-driver stage and configured to introduce a feedback response that reduces the gain when the input signal of the pre-driver stage has a power level at or below a selected level, and to disable or provide a reduced feedback response when the input signal of the pre-driver stage has a power level that exceeds the selected level.

In some embodiments, the amplifier circuit can be a power amplifier circuit.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
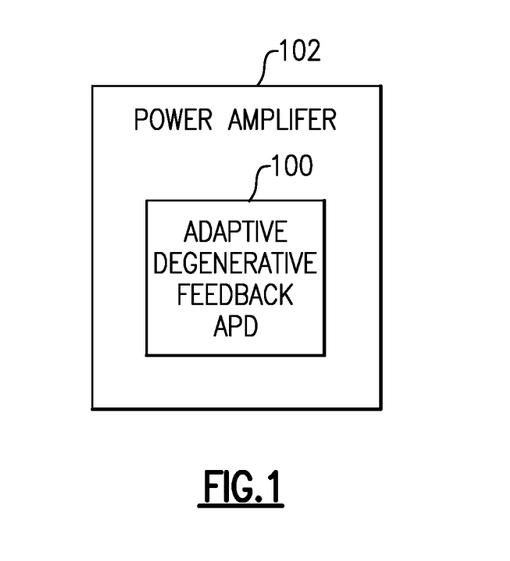
FIG. 1 depicts a power amplifier having an analog pre-distortion (APD) component.

FIG. 1 depicts a power amplifier 102 having an analog pre-distortion (APD) component 100. Although various examples are described in the context of power amplifiers, it will be understood that one or more features of the present disclosure can also be implemented in other types of amplifiers.

Figure 2:
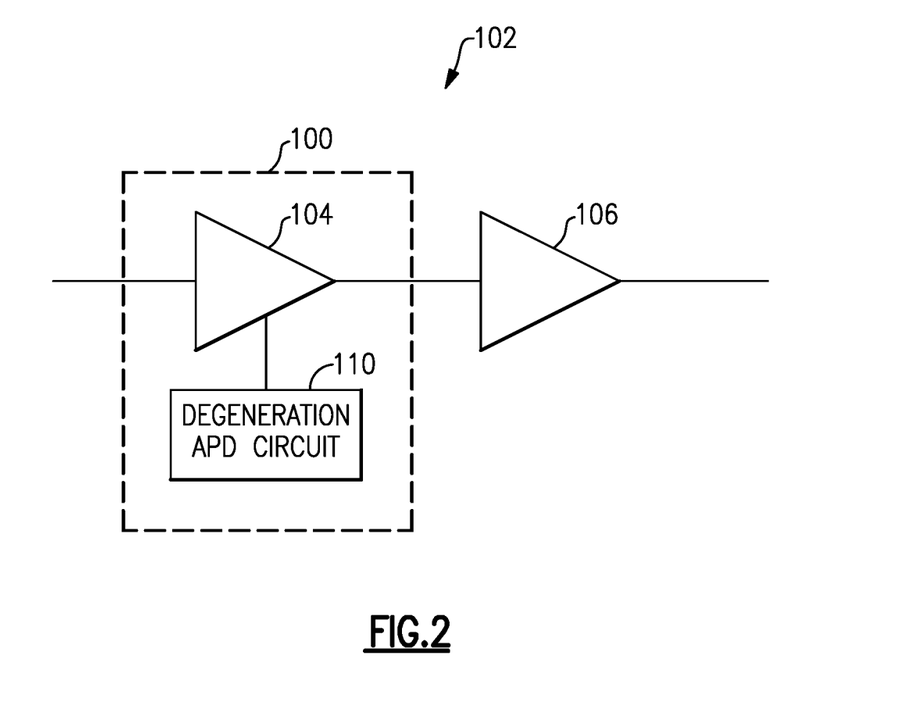
FIG. 2 shows that in some embodiments, the APD component of FIG. 1 can be implemented to include a pre-driver stage and an associated degeneration APD circuit.

FIG. 2 shows that in some embodiments, the APD component 100 of FIG. 1 can be implemented to include, or be associated with, a pre-driver stage 104 and an associated degeneration APD circuit 110. In some embodiments, an output of the pre-driver stage 104 can be provided to one or more amplification stages (collectively indicated as 106) of the power amplifier 102.

Figure 3:
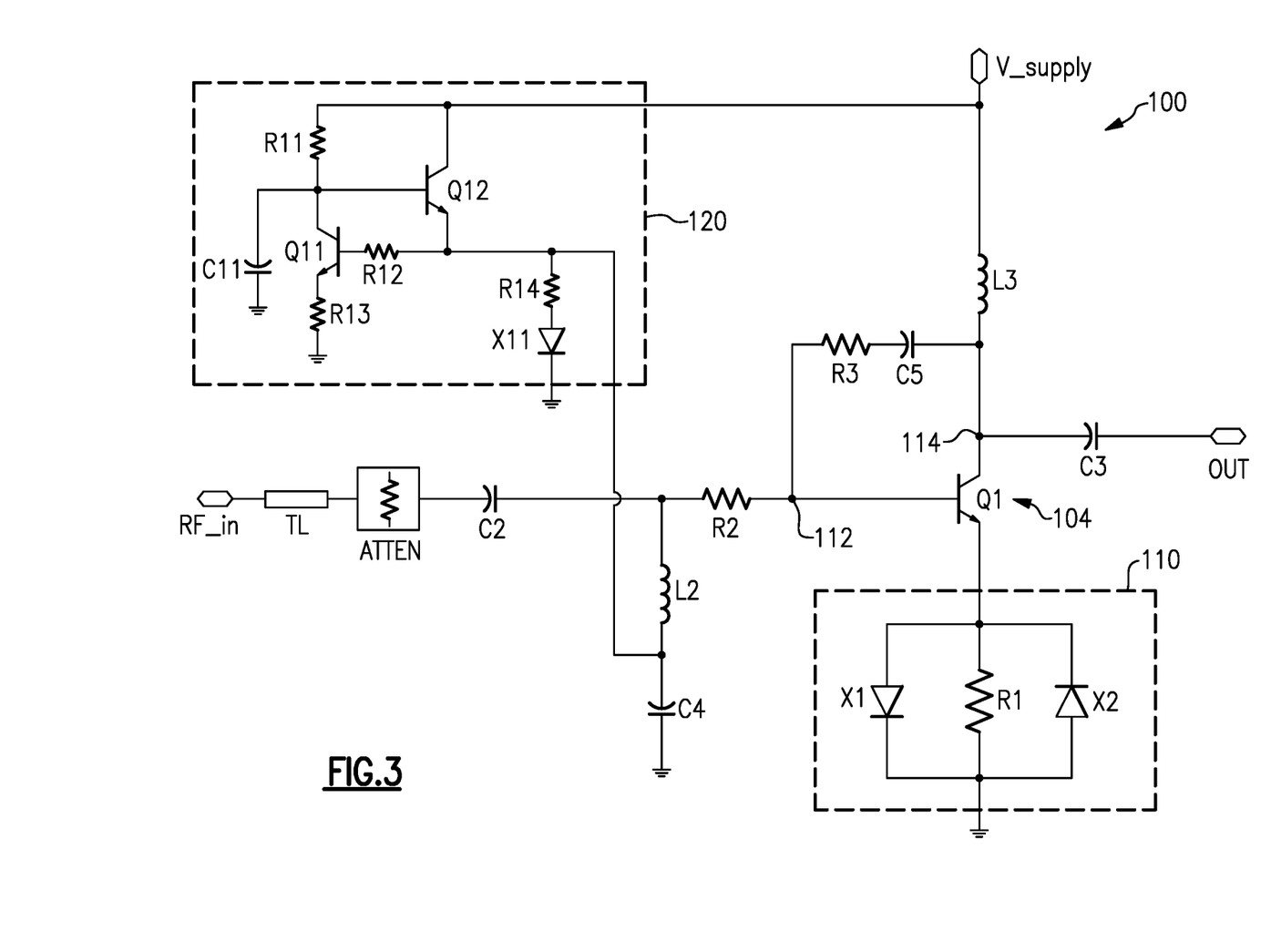
FIG. 3 shows a more specific example of the APD component of FIG. 2.
Figure 4:
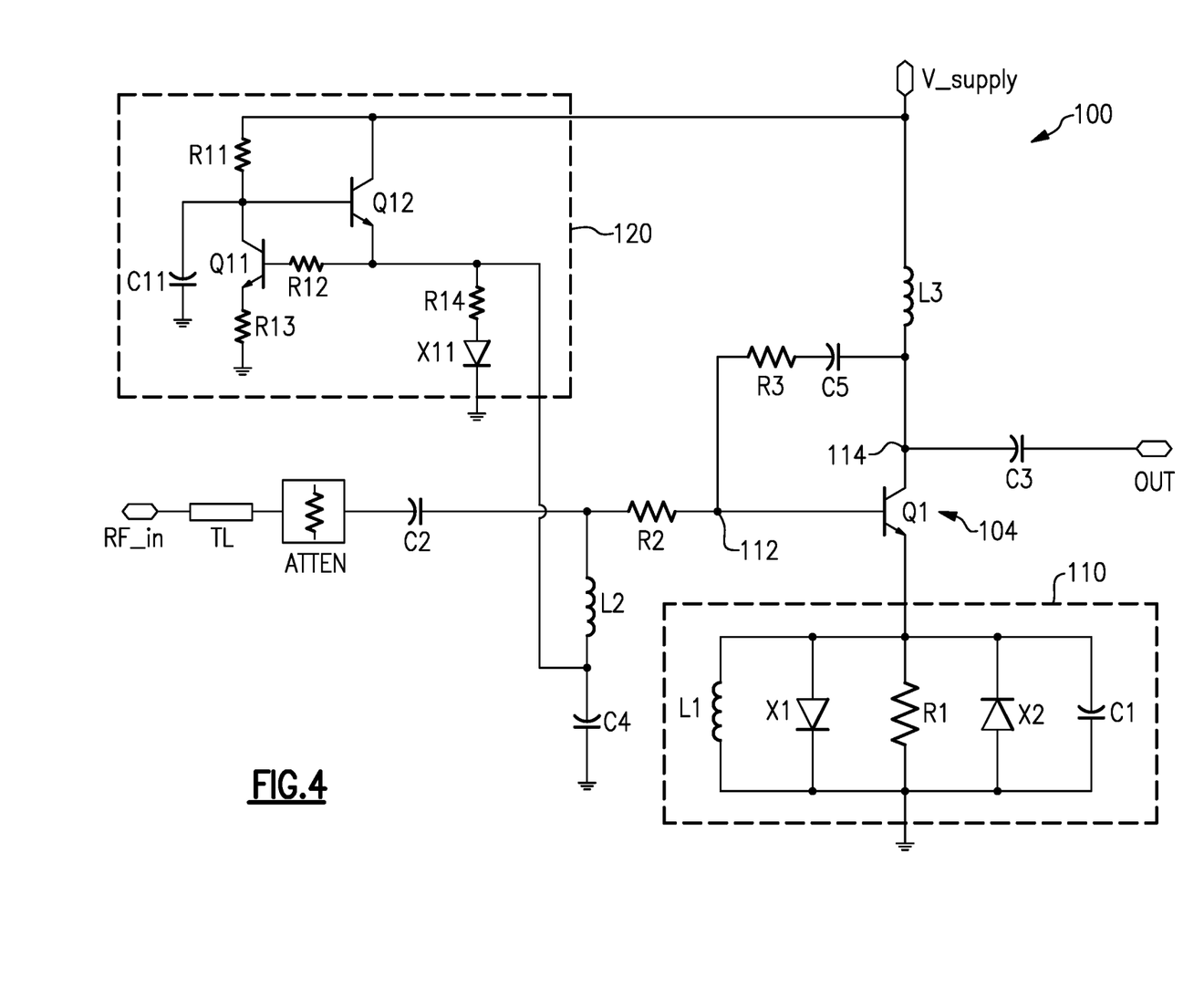
FIG. 4 shows another more specific example of the APD component of FIG. 2.
Figure 5:
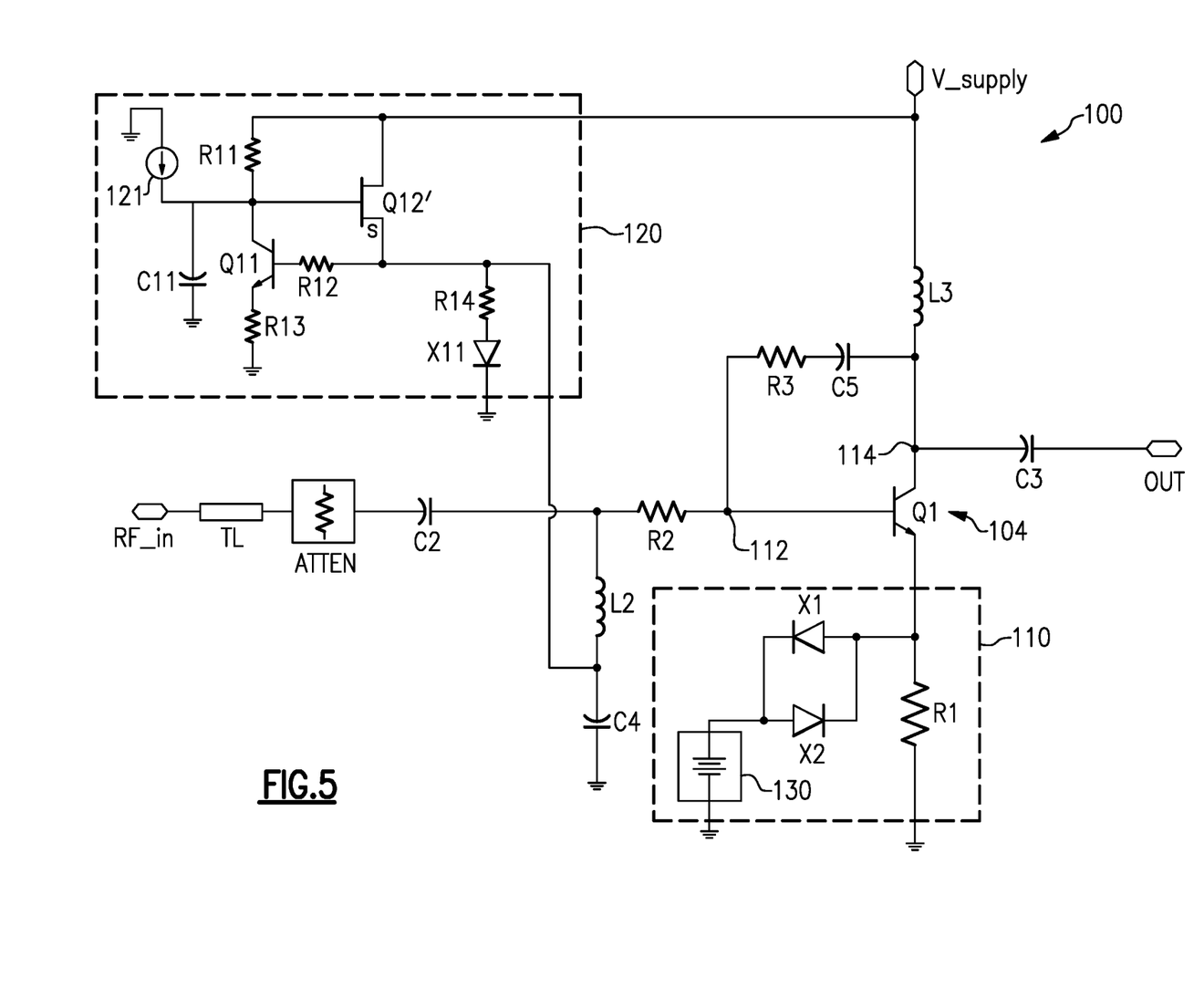
FIG. 5 shows yet another more specific example of the APD component of FIG. 2.

FIGS. 3 to 5 show more specific examples of the APD component 100 of FIG. 2. In each of the examples of FIGS. 3 to 5, an APD component 100 can include, or be associated with, a pre-driver stage 104 implemented with a bipolar junction transistor Q1 having a base, a collector, and an emitter. Although various examples are described in the context of such a bipolar junction transistor, it will be understood that one or more features of the present disclosure can also be implemented utilizing other types of transistors, including a field-effect transistor having a gate, a drain, and a source.

Referring to FIGS. 3 to 5, the base of the transistor Q1 can receive a radio-frequency (RF) signal from an input node (RF_in), through an input signal path. In some embodiments, such an input signal path can include some or all of a transmission line (TL) (or a portion of the signal path behaving like a transmission line), an attenuator (Atten), a DC block capacitance C2, and a base resistance R2.

The base of the transistor Q1 can be provided with a bias signal from a biasing circuit 120. In some embodiments, such an example biasing circuit can include a current mirror arrangement of transistors Q11 and Q12, where the base of Q12 is coupled to the collector of Q11, and the base of Q11 is coupled to the emitter of Q12 through a resistance R12. The collector of Q11 is shown to be coupled to a supply voltage node V_supply through a resistance R11, and the collector of Q12 is coupled to the supply voltage node V_supply. The collector of Q11 is shown to be coupled to ground through a capacitance C11, and the emitter of Q11 is shown to be coupled to ground through a resistance R13. The emitter of Q12 is shown to be coupled to ground through a series arrangement of a resistance R14 and a diode X11.

With the foregoing example biasing circuit 120, the bias signal can be provided to the base of Q1 through an inductance L2 and the base resistance R2. In some embodiments, a node between C2 and R2 can be coupled to ground through a series arrangement of the inductance L2 and a capacitance C4.

In some embodiments, and referring to FIGS. 3 to 5, a feedback circuit can be provided between the output 114 of Q1 and the input 112 of Q1. Such a feedback circuit can include a series arrangement of a capacitance C5 and a resistance R3. Values of C5 and/or R3 can be selected to provide a gain-setting functionality for the transistor Q1.

Referring to FIGS. 3 to 5, a supply voltage can be provided to the collector of the transistor Q1 from the supply voltage node V_supply, through an inductance L3. The collector of the transistor Q1 can also provide an output signal having a gain relative to the input signal, to an output node (Out) through an output signal path. In some embodiments, such an output signal path can include a DC block capacitance C3.

In each of the examples of FIGS. 3 to 5, an APD component 100 is shown to include a degeneration APD circuit 110 that couples the emitter of the respective transistor Q1 to ground. For example, FIG. 3 shows that in some embodiments, a degeneration APD circuit 110 can include an electrically parallel arrangement of a resistance R1, a first diode X1, and a second diode X2, and such a parallel arrangement can be implemented to be electrically between the emitter of Q1 and the ground. In some embodiments, the first diode X1 can be arranged so that its anode is coupled to the emitter of Q1, and its cathode is coupled to the ground. The second diode X2 can be arranged so that its cathode is coupled to the emitter of Q1, and its anode is coupled to the ground.

Configured in the foregoing manner, the degeneration APD circuit 110 can introduce a non-linear feedback response by way of an emitter degeneration that reduces gain of the transistor Q1 when the input RF signal has low power. When the input RF signal has high power, the anti-parallel arrangement of the first and second diodes X1, X2 can provide a shunt path between the emitter of Q1 and the ground, and thereby disable the degeneration APD circuit 110.

It is noted that gain expansion provided by the transistor Q1 can be steep with the use of the degeneration APD circuit 110 (e.g., on the order of 1 dB expansion per 1 dB increase in power of the input RF signal). As the power (Pin) of the input RF signal reaches a selected level (e.g., Pin=0 dBm), DC voltage across emitter resistor R1 becomes sufficiently high to turn on the diodes X1, X2. After such turning on of the diodes X1, X2, the gain-reducing effect of the degeneration APD circuit 110 diminishes, and the gain provided by the transistor Q1 increases. Accordingly, power of the input signal (i.e., the output of Q1) provided to the one or more amplification stages (106 in FIG. 2) of the power amplifier increases rapidly.

In some embodiments, the foregoing rapid gain expansion provided by the APD component 100 can be configured to compensate for gain compression of the one or more amplification stages of the power amplifier. In some embodiments, such a rapid gain expansion compensation can result in an increased range of linear power amplification capability (e.g., an increase by approximately 1 dB).

It is noted that in some embodiments, an APD component having one or more features as described herein can provide a rate of gain expansion that is much higher than that of conventional diode pre-distorters.

In some embodiments, the above-described selected level of the power (Pin) of the input RF signal at which the diodes (X1, X2) turn on to result in gain expansion can be selected as $P_{exp}=(V_{diode}^2/R_e)*(R_{load}/R_e)^2$, where $P_{exp}$ is gain expansion threshold power, $V_{diode}$ is turn-on voltage for the diodes (X1, X2), $R_e$ is the emitter resistance (R1 in FIG. 3), and $R_{load}$ is load resistance associated with the transistor Q1.

In some embodiments, initial gain of the transistor Q1 can be $G_v=R_{load}/R_e$. In some embodiments, such an initial gain of the transistor Q1 can be adjusted by selecting the above-described resistance R3 of the feedback circuit between the output 114 and input 112 of the transistor Q1.

In another example, FIG. 4 shows that in some embodiments, a degeneration APD circuit 110 can be similar to the example of FIG. 3, and also include an optional phase control functionality (e.g., AM-to-PM). For example, an inductance L1 and a capacitance C1 can be provided to be electrically parallel with the emitter resistance R1, between the emitter of Q1 and the ground. Either or both of L1 and C1 can be selected to provide the phase control functionality.

In the example of FIG. 4, other parts of the APD component 100 can be similar to the example of FIG. 3.

In some embodiments, an APD component having one or more features as described herein can be configured so that gain expansion threshold of a degeneration APD circuit can be compensated for variations in temperature. For example, FIG. 5 shows that in some embodiments, a degeneration APD circuit 110 can be configured to provide temperature compensation by applying an external bias to the diodes X1, X2.

For example, a voltage source 130 can be provided between each of the diodes X1, X2 and the ground, and such a voltage source can be configured to provide a voltage that depends on temperature. For example, such a temperature-dependent voltage can be Vdc=(T−25)(0.001), where T is temperature associated with operation of Q1 in ° C., and Vdc is in volts.

In the foregoing example, implementation of the Vdc can be supported by an approximately 1 mV/° C. added to the bias signal provided to the base of Q1. In some embodiments, such a temperature-dependent bias signal can be provided by an appropriately configured biasing circuit 120.

For example, and referring to FIG. 5, a biasing circuit 120 can include a field-effect transistor Q12' implemented as a source follower, replacing the transistor Q12 of FIGS. 3 and 4. With such a transistor (Q12'), the gate, drain, and source of Q12' can correspond to the base, collector, and emitter of Q12. The biasing circuit 120 can further include a current source 121 implemented between the collector of Q11 and ground. Configured in the foregoing example manner, the biasing circuit 120 can support the temperature-dependent bias signal provided to the transistor Q1.

In some embodiments, gain of one or more power amplification stages coupled to the output of the APD component 100 of FIG. 5 can be approximately uniform over a desired temperature range associated with operation of Q1.

Figure 6:
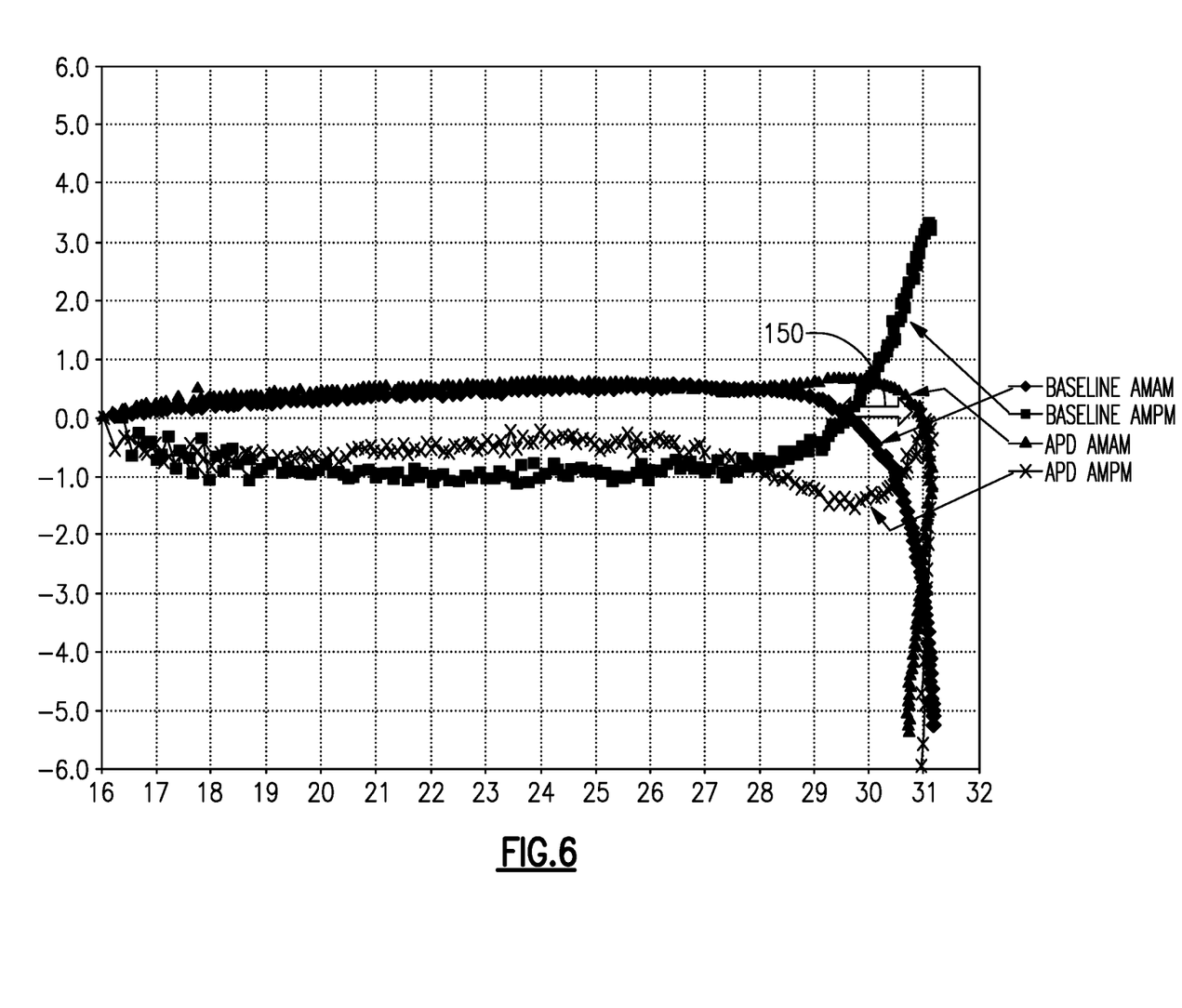
FIG. 6 shows examples of AM-AM and AM-PM plots for power amplifiers with an analog pre-distortion (APD) and without (baseline) an APD component as described herein.

FIG. 6 shows examples of AM-AM and AM-PM plots for power amplifiers with an analog pre-distortion (APD) and without (baseline) an APD as described herein. Among others, FIG. 6 shows (baseline AM-AM vs APD AM-AM plots) that gain expansion provided by the APD component compensates for gain compression of the respective power amplifier, and thereby desirably pushes out (arrow 150) the compression transition point to a higher power value. In the example of FIG. 6, such an extension of the compression transition point is shown to be approximately 1.5 dB.

Figure 7:
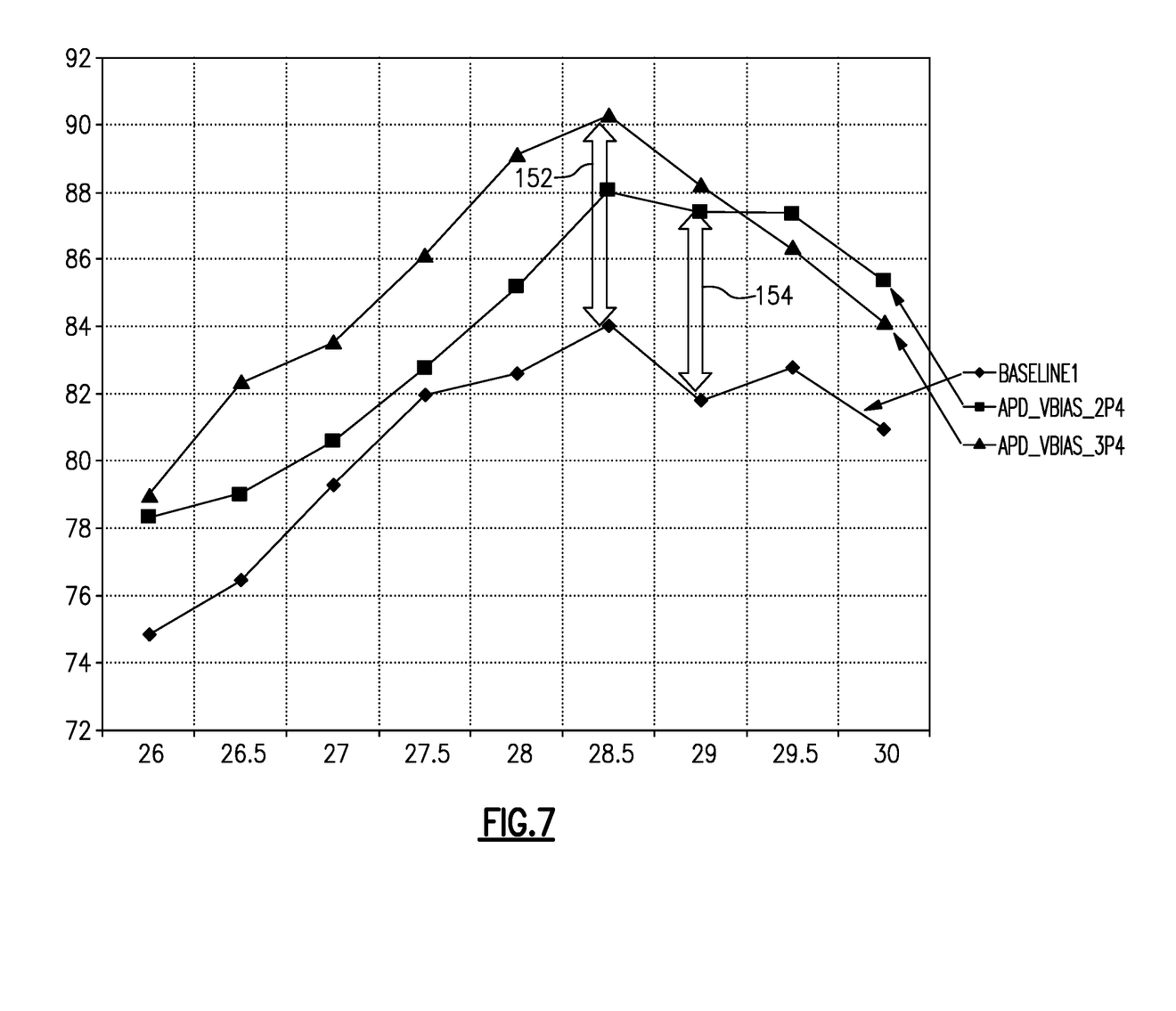
FIG. 7 shows examples of figure-of-merit (FOM) for power amplifiers with an APD and without (baseline) an APD component as described herein.

FIG. 7 shows examples of figure-of-merit (FOM) for power amplifiers with an APD and without (baseline) an APD component as described herein. The curve indicated as Baseline 1 is for a power amplifier without an APD component, and the curves indicated as APD_VBIAS_2P4 and APD_VBIAS_3P4 are for a power amplifier with an APD component operated at different bias voltages. One can see that each of the FOM plots for the two bias settings of the APD component shows an improvement of 6 points in FOM (arrows 152, 154).

Figure 8:
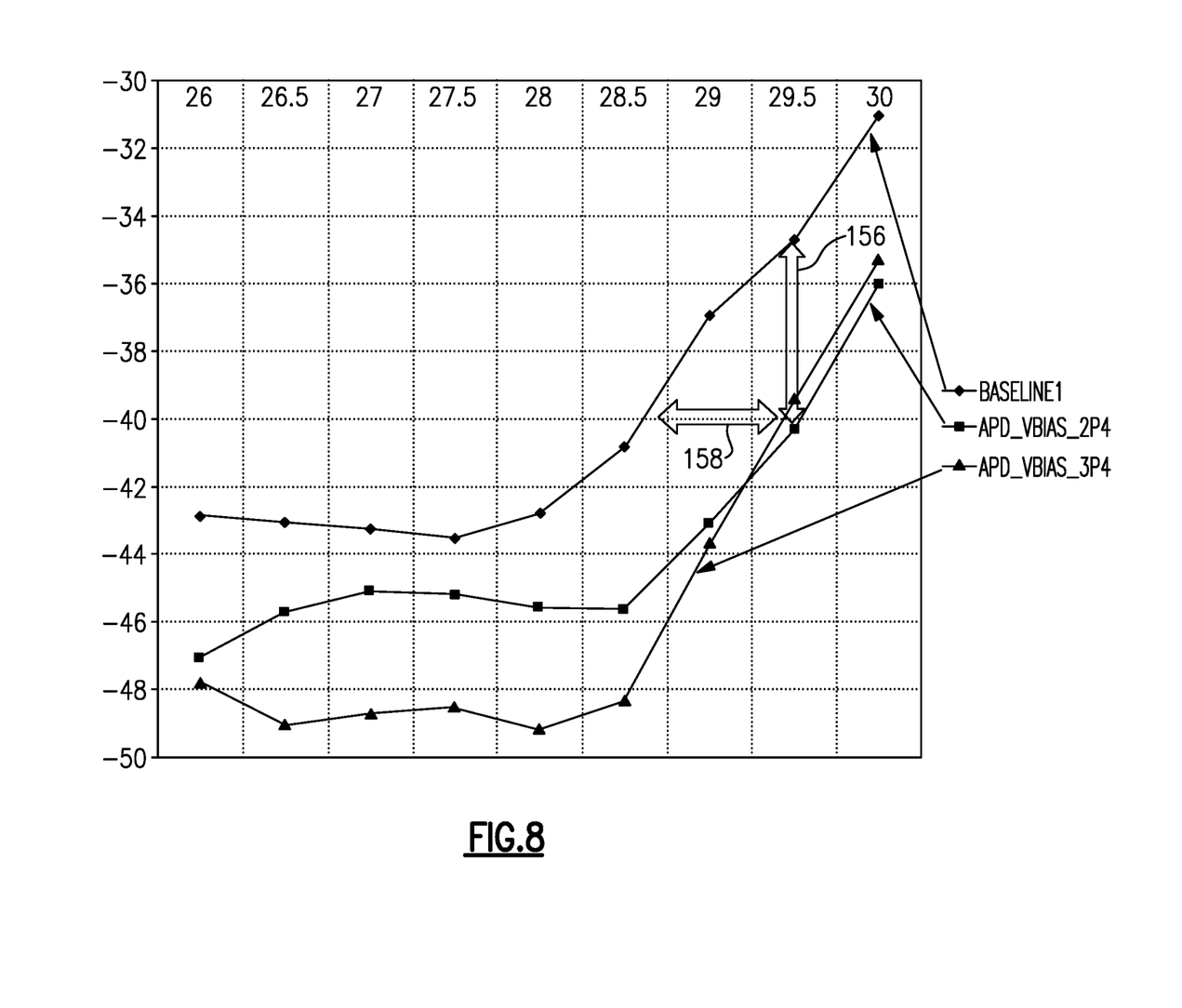
FIG. 8 shows examples of ACLR for power amplifiers with an APD and without (baseline) an APD component as described herein.

FIG. 8 shows examples of ACLR for power amplifiers with an APD and without (baseline) an APD component as described herein. The curve indicated as Baseline 1 is for a power amplifier without an APD component, and the curves indicated as APD_VBIAS_2P4 and APD_VBIAS_3P4 are for a power amplifier with an APD component operated at different bias voltages. One can see that each of the ACLR plots for the two bias settings of the APD component shows an approximately 1 dB increase in power headroom (arrow 158), and an approximately 5 dB improvement in ACLR (arrow 156).

Figure 9A:
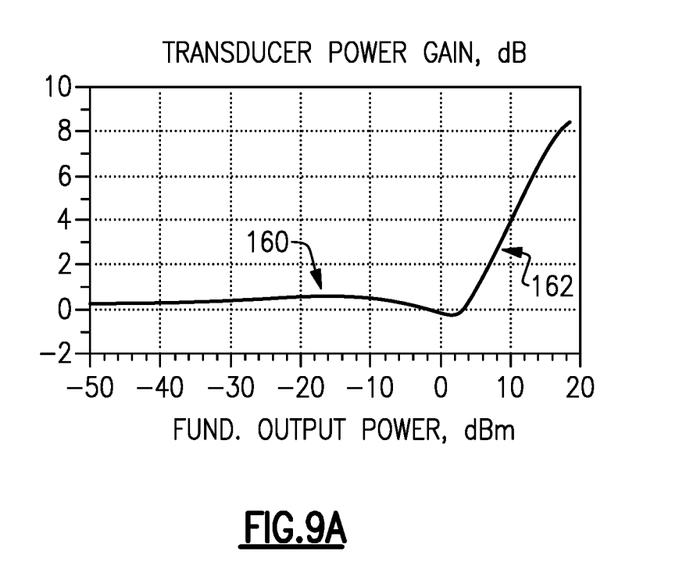
FIGS. 9A and 9B show examples of responses of the APD component of FIG. 4.
Figure 9B:
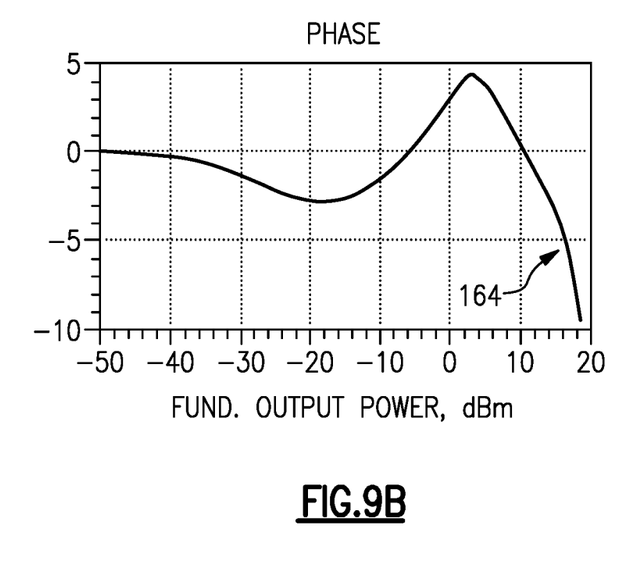

FIGS. 9A and 9B show examples of responses of the APD component 100 of FIG. 4 in which the emitter degeneration APD circuit 110 includes the inductance L1 and the capacitance C1, as a function of input power. It is noted that in the examples of FIGS. 9A and 9B, the threshold power level for inducing gain expansion is at approximately 0 dBm.

In FIG. 9A, one can see that when the input power is less than 0 dBm (in region 160), the gain of the APD component 100 remains at a reduced level. When the input power exceeds the example threshold value of 0 dBm, the diodes (X1, X2 in FIG. 4) of the emitter degeneration APD circuit 110 are turned on, and the APD component 100 provides a steep gain expansion response (in region 162).

In FIG. 9B, an example AM-to-PM response is shown for a corresponding set of L1 and C1 of the emitter degeneration APD circuit 110 of FIG. 4. In some embodiments, values of L1 and/or C1 can be selected to control at least a portion (164) of the AM-to-PM response corresponding to the steep gain expansion region 162. For example, the phase response portion 164 can be tailored to be opposite, or approximately opposite, of an AM-to-PM response of one or more power amplification stages downstream of the APD component 100.

Figure 10:
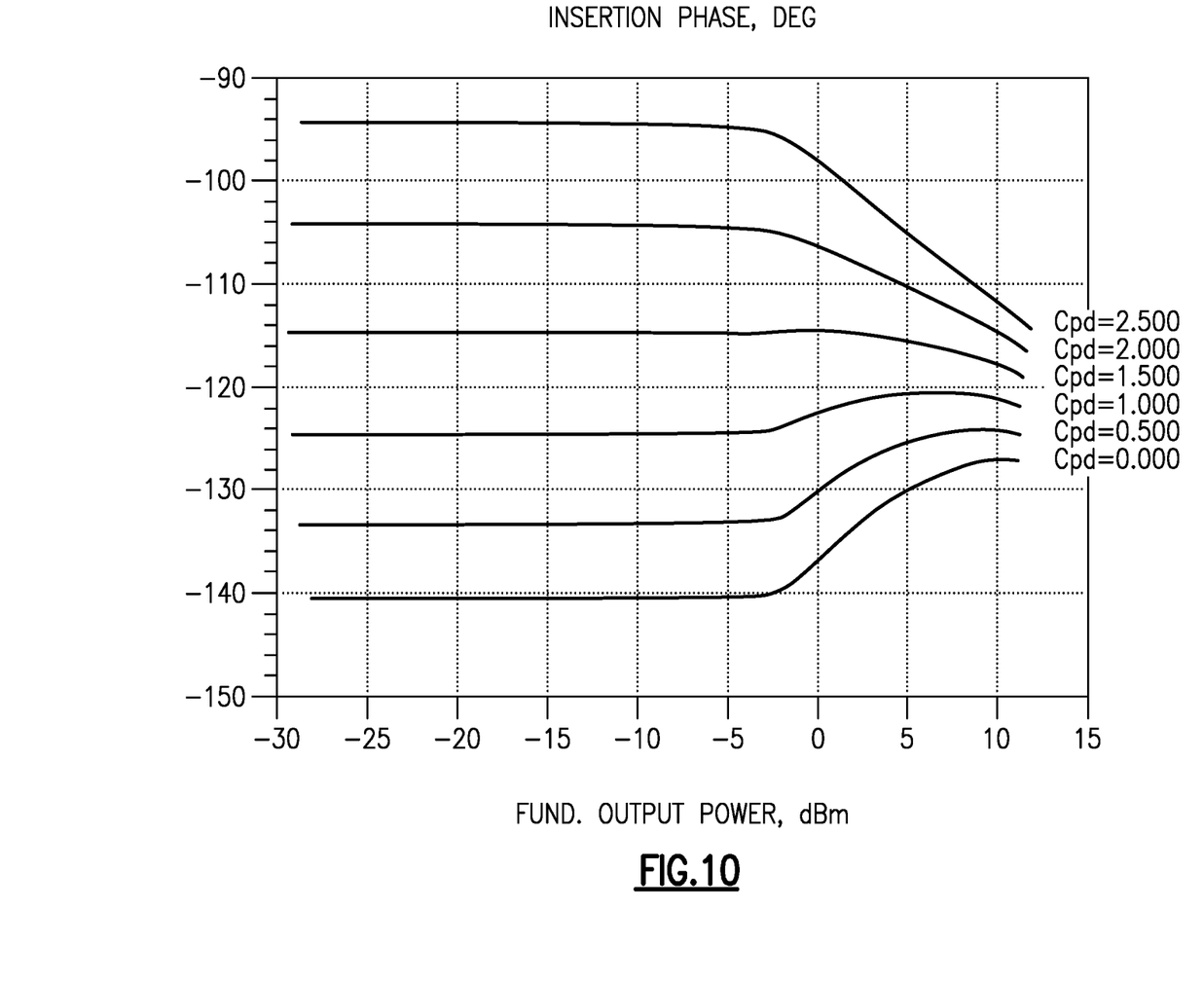
FIG. 10 shows an example of how direction and amount of phase pre-distortion can be controlled by appropriately selecting values of an inductance and a capacitance associated with the APD component of FIG. 4.
Figure 11A:
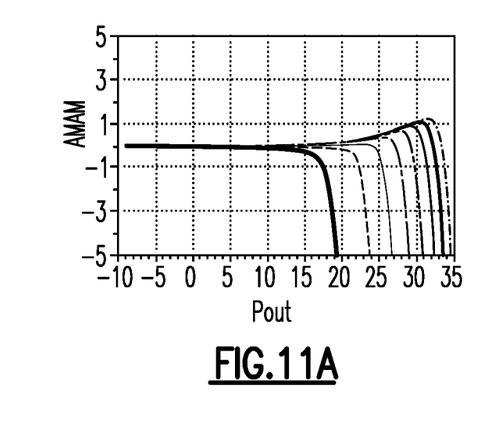
FIGS. 11A to 11D show examples of AM-AM plots, AM-PM plots, gain plots, and power added efficiency (PAE) plots, as functions of output power Pout, for different supply voltage levels of an envelope tracking power amplifier without an APD component.
Figure 11B:
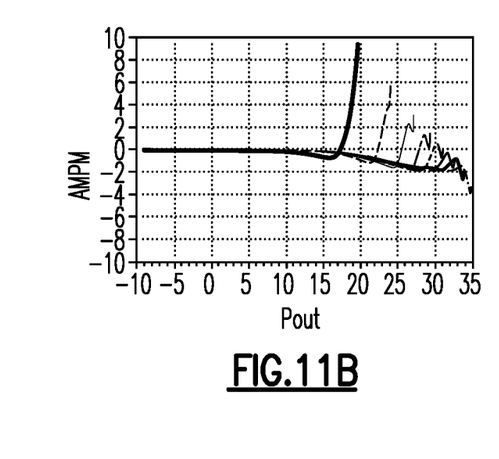
Figure 11C:
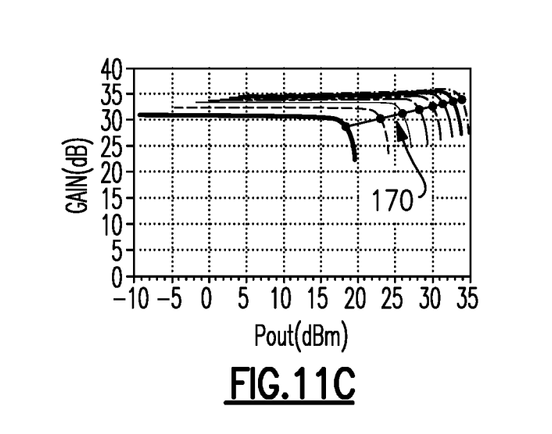
Figure 11D:
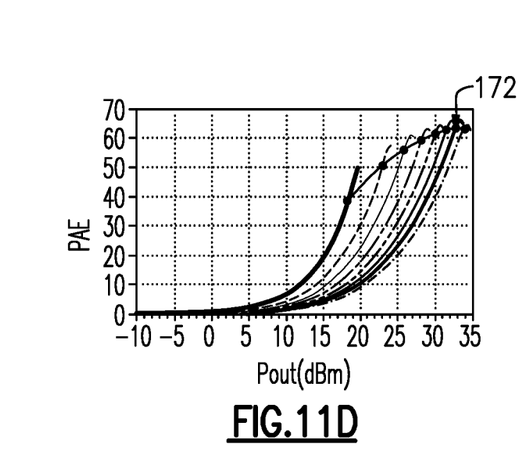

FIG. 10 shows an example of how direction and amount of phase pre-distortion (such as the example of FIG. 9B) can be controlled by appropriately selecting values of L1 and C1 of the emitter degeneration APD circuit 110 of FIG. 4. In FIG. 10, various phase responses are shown for respective capacitance values (Cpd, in pF) of C1, for a given value of L1. As described herein, such a functionality can be utilized to provide phase control while providing the emitter degeneration APD functionality.

FIGS. 11A to 11D show examples of AM-AM plots (FIG. 11A), AM-PM plots (FIG. 11B), gain plots (FIG. 11C), and power added efficiency (PAE) plots (FIG. 11D), as functions of output power Pout, for different supply voltage levels of an envelope tracking power amplifier without an APD component. FIGS. 12A to 12D show examples of AM-AM plots (FIG. 12A), AM-PM plots (FIG. 12B), gain plots (FIG.

Figure 12A:
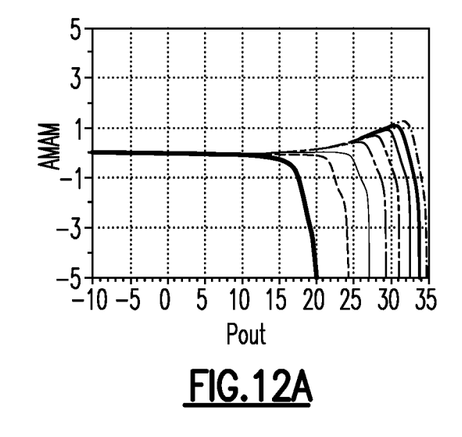
FIGS. 12A to 12D show examples of AM-AM plots, AM-PM plots, gain plots, and power added efficiency (PAE) plots, as functions of output power Pout, for different supply voltage levels of an envelope tracking power amplifier with an APD component.
Figure 12B:
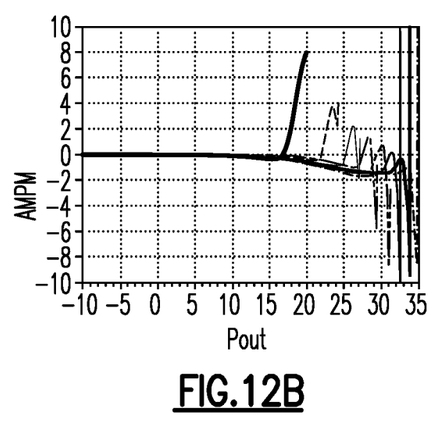
Figure 12C:
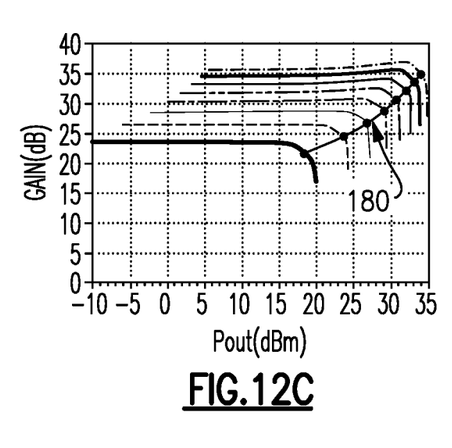
Figure 12D:
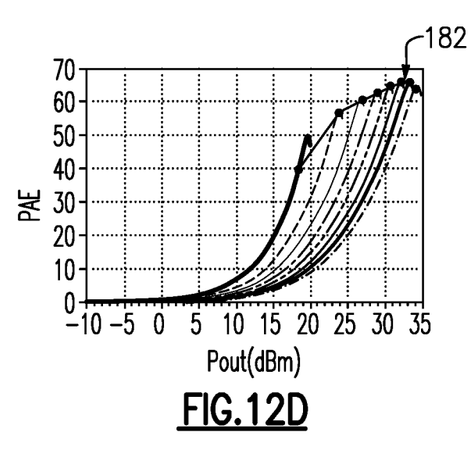

12C), and power added efficiency (PAE) plots (FIG. 12D), as functions of output power Pout, for different supply voltage levels of an envelope tracking power amplifier with an APD component.

Among others, FIGS. 11 and 12 show that the power amplifier without an APD component has a relatively soft compression profile (e.g., profile 170 in FIG. 11C), while the power amplifier with an APD component has a sharper compression profile (e.g., profile 180 in FIG. 12C). It is also noted that the power amplifier without an APD component can have a sub-optimal PAE profiles (e.g., profile 172 in FIG. 11D), while the power amplifier with an APD component can have a PAE profile that ride on tops of some or all of the various PAE curves (e.g., profile 182 in FIG. 12D).

Figure 13:
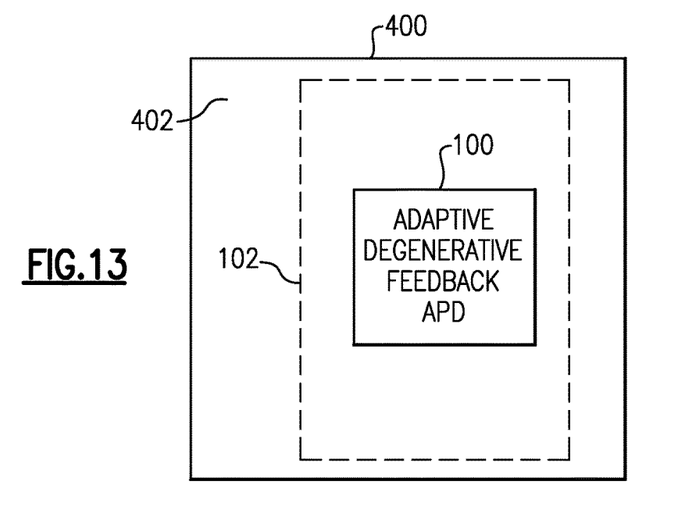
FIG. 13 shows that in some embodiments, one or more features of the present disclosure can be implemented in a packaged module.

FIG. 13 shows that in some embodiments, one or more features of the present disclosure can be implemented in a packaged module 400. Such a module can include a packaging substrate 402 configured to receive a plurality of components. Some or all of such components can be implemented to provide a power amplifier 102 with an APD component 100 having one or more features as described herein.

In some implementations, an architecture, device and/or circuit having one or more features described herein can be included in an RF device such as a wireless device. Such an architecture, device and/or circuit can be implemented directly in the wireless device, in one or more modular forms as described herein, or in some combination thereof. In some embodiments, such a wireless device can include, for example, a cellular phone, a smart-phone, a hand-held wireless device with or without phone functionality, a wireless tablet, a wireless router, a wireless access point, a wireless base station, etc. Although described in the context of wireless devices, it will be understood that one or more features of the present disclosure can also be implemented in other RF systems such as base stations.

Figure 14:
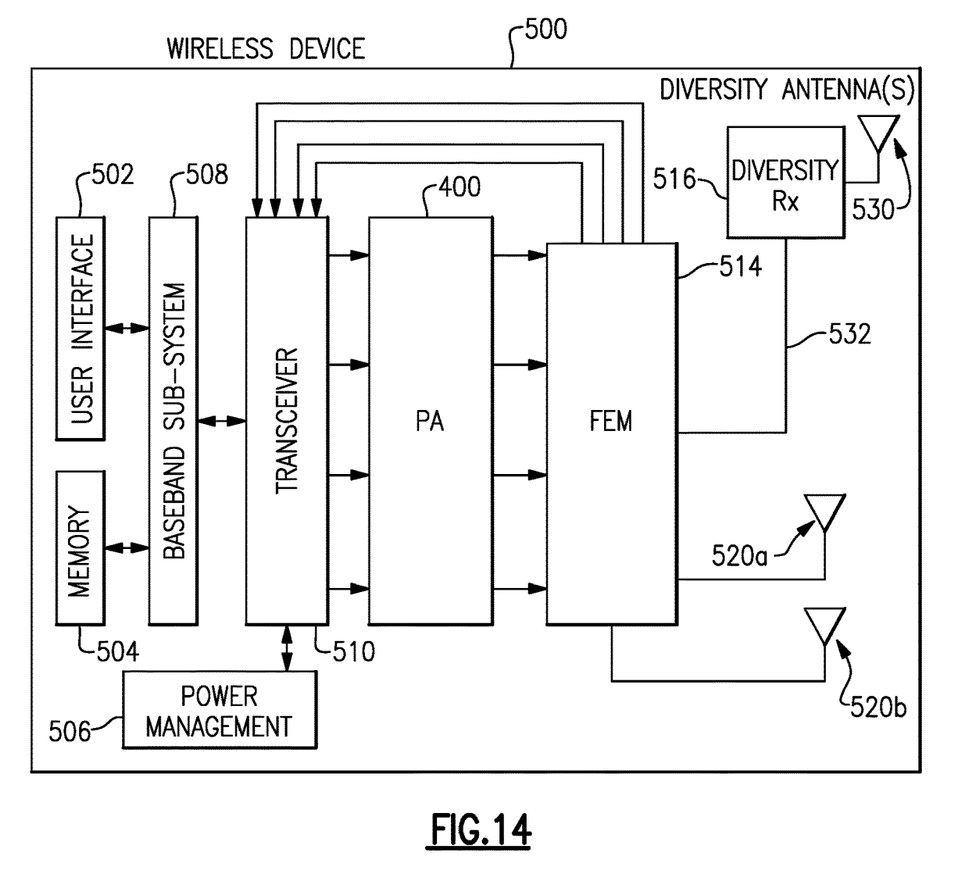
FIG. 14 schematically depicts an example wireless device having one or more advantageous features described herein.

FIG. 14 schematically depicts an example wireless device 500 having one or more advantageous features described herein. In some embodiments, such advantageous features can be implemented in, for example, a power amplifier module (PAM) 400.

In the example of FIG. 14, power amplifiers (PAs) in the PA module 400 can receive their respective RF signals from a transceiver 510 that can be configured and operated to generate RF signals to be amplified and transmitted, and to process received signals. At least some of the power amplifiers can include an APD component as described herein.

The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example wireless device 500, a front-end module 514 can be configured to support transmit and/or receive operations utilizing one or more antennas. For example, one or more primary antennas 520a, 520b can be provided, and each antenna can support transmit and/or receive operations through the front-end module 514. In another example, a diversity antenna 530 can be provided, and such an antenna can support at least a receive operation through a diversity receive module 516 coupled to the front-end module 514 through a path 532.

In some embodiments, at least some of the signals received through the front-end module 514 can be routed to the transceiver 510. Such received signals may or may not be amplified by low-noise amplifiers.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A pre-distortion circuit for an amplifier, comprising:
a transistor having an input node for receiving an input signal, an output node for providing an output signal having a gain relative to the input signal, and a common node for coupling to a ground; and
a degeneration circuit implemented between the common node and the ground, the degeneration circuit configured to introduce a feedback response that reduces the gain when the input signal has a power level at or below a selected level, the degeneration circuit further configured to be disabled or provide a reduced feedback response when the input signal has a power level that exceeds the selected level, the degeneration circuit including a resistance implemented between the common node and the ground, and an antiparallel combination of first and second diodes implemented between the common node and the ground, the first and second diodes configured to turn on when the power level of the input signal exceeds the selected level.

2. The pre-distortion circuit of claim 1 wherein the transistor is implemented as a bipolar-junction transistor having a base, an emitter, and a collector, such that the base provides the input node, the collector provides the output node, and the emitter provides the common node.

3. The pre-distortion circuit of claim 1 wherein the degeneration circuit is further configured to provide a phase control functionality.

4. The pre-distortion circuit of claim 3 wherein the phase control functionality includes an AM-to-PM phase control functionality.

5. The pre-distortion circuit of claim 3 wherein the degeneration circuit further includes an inductance and a capacitance, each implemented to be electrically parallel with the resistance, and between the common node and the ground.

6. The pre-distortion circuit of claim 5 wherein at least one of the inductance and the capacitance is configured to provide the phase control functionality.

7. The pre-distortion circuit of claim 1 wherein the degeneration circuit is further configured such that the selected level is compensated for a variation in temperature.

8. The pre-distortion circuit of claim 7 wherein the degeneration circuit further includes a voltage source configured to apply a bias to the first and second diodes.

9. The pre-distortion circuit of claim 8 wherein the voltage source is implemented to be between each of the first and second diodes and the ground.

10. The pre-distortion circuit of claim 8 wherein the voltage source is configured to provide a temperature-dependent voltage to each of the first and second diodes.

11. A method for pre-distorting a signal for an amplifier, the method comprising:
providing a transistor having an input node for receiving an input signal, an output node for providing an output signal having a gain relative to the input signal, and a common node for coupling to a ground; and
introducing a feedback response, with a degeneration circuit implemented between the common node and the ground, such that the feedback response includes a reduction in the gain when the input signal has a power level at or below a selected level, and a disablement or a reduction of the feedback response when the input signal has a power level that exceeds the selected level, the degeneration circuit including a resistance implemented between the common node and the ground, and an antiparallel combination of first and second diodes implemented between the common node and the ground, the first and second diodes configured to turn on when the power level of the input signal exceeds the selected level.

12. An amplifier comprising:
a pre-driver stage including a transistor having an input node for receiving an input signal, an output node for an output signal provided by the transistor and having a gain relative to the input signal, and a common node for coupling to a ground;
an amplification stage configured to receive an input signal representative of the output signal of the pre-driver stage and to generate an amplified signal; and
a pre-distortion circuit coupled to the pre-driver stage and configured to introduce a feedback response that reduces the gain when the input signal of the pre-driver stage has a power level at or below a selected level, and to disable or provide a reduced feedback response when the input signal of the pre-driver stage has a power level that exceeds the selected level, the pre-distortion circuit including a degeneration circuit that includes a resistance implemented between the common node and the ground, and an antiparallel combination of first and second diodes implemented between the common node and the ground, the first and second diodes configured to turn on when the power level of the input signal exceeds the selected level.

13. The amplifier of claim 12 wherein the degeneration circuit is further configured to provide a phase control functionality.

14. The amplifier of claim 12 wherein the degeneration circuit is further configured such that the selected level is compensated for a variation in temperature.

15. The amplifier of claim 12 wherein the amplifier is a power amplifier.

* * * * *